United States Patent
Chen

(10) Patent No.: US 10,153,379 B2
(45) Date of Patent: Dec. 11, 2018

(54) THIN-FILM TRANSISTOR AND MANUFACTURING METHOD THEREOF

(71) Applicant: Wuhan China Star Optoelectronics Technology Co., Ltd., Wuhan (CN)

(72) Inventor: Zhe Chen, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 128 days.

(21) Appl. No.: 15/505,108

(22) PCT Filed: Dec. 29, 2016

(86) PCT No.: PCT/CN2016/113018
§ 371 (c)(1),
(2) Date: Feb. 20, 2017

(87) PCT Pub. No.: WO2018/119879
PCT Pub. Date: Jul. 5, 2018

(65) Prior Publication Data
US 2018/0226507 A1 Aug. 9, 2018

(30) Foreign Application Priority Data

Dec. 20, 2016 (CN) .......................... 2016 1 1215265

(51) Int. Cl.
*H01L 29/786* (2006.01)
*H01L 29/66* (2006.01)
(Continued)

(52) U.S. Cl.
CPC ...... *H01L 29/7869* (2013.01); *H01L 27/1214* (2013.01); *H01L 27/3244* (2013.01);
(Continued)

(58) Field of Classification Search
CPC ............. H01L 29/7869; H01L 51/0018; H01L 51/0023; H01L 51/105; H01L 51/0558; H01L 51/0508; H01L 51/0512
See application file for complete search history.

(56) References Cited

U.S. PATENT DOCUMENTS

| 7,754,523 B2 * | 7/2010 | Seo ..................... H01L 51/0017 438/149 |
| 8,829,499 B2 * | 9/2014 | Ono .................... H01L 51/0018 257/40 |
| 2013/0075731 A1 * | 3/2013 | Han .................. H01L 29/66765 257/57 |

* cited by examiner

*Primary Examiner* — Jose R Diaz
(74) *Attorney, Agent, or Firm* — Leong C. Lei

(57) ABSTRACT

The present invention provides a thin-film transistor and a manufacturing method thereof. The manufacturing method of the thin-film transistor according to the present invention is such that by forming a first photoresist layer on an active layer and using a mask associated with the active layer to pattern the first photoresist layer so as to form the first photoresist pattern, the first photoresist pattern so formed provides protection of the active layer against corrosion caused by acidic etchant solution in the subsequently conducted etching operation of source and drain electrodes so as to function as an etching stopper layer and further, a major portion of the first photoresist pattern can be removed in a photolithographic process of the source and drain electrodes so that only a minor portion is left in the finally-formed thin-film transistor and does not affect the properties of the thin-film transistor. The thin-film transistor according to the present invention has a simple manufacturing process and a low manufacturing cost and the surface of the active layer is flat and smooth. The thin-film transistor shows excellent properties.

13 Claims, 15 Drawing Sheets

(51) Int. Cl.
  *H01L 27/32* (2006.01)
  *H01L 27/12* (2006.01)
  *H01L 51/00* (2006.01)
  *H01L 51/10* (2006.01)
  *H01L 51/05* (2006.01)
  *H01L 29/06* (2006.01)
(52) U.S. Cl.
  CPC .... *H01L 29/0657* (2013.01); *H01L 29/66742* (2013.01); *H01L 29/66757* (2013.01); *H01L 29/78618* (2013.01); *H01L 29/78624* (2013.01); *H01L 29/78627* (2013.01); *H01L 51/0018* (2013.01); *H01L 51/0023* (2013.01); *H01L 51/0508* (2013.01); *H01L 51/0512* (2013.01); *H01L 51/0558* (2013.01); *H01L 51/105* (2013.01)

THIN-FILM TRANSISTOR AND MANUFACTURING METHOD THEREOF

BACKGROUND OF THE INVENTION

1. Field of the Invention

The present invention relates to the field of display technology, and more particular to a thin-film transistor and a manufacturing method thereof.

2. The Related Arts

Organic light-emitting diode (OLED) displays, which are also known as organic electroluminescent displays, are a newly emerging flat panel display device and possess advantages, such as simple manufacturing operation, low costs, reduced power consumption, high luminous brightness, wide range of operation temperature, compact size, fast response, easy realization of color displaying and large-screen displaying, easy realization of matching with integrated circuit (IC) driver, and easy realization of flexible displaying, and show future prosperity of wide applications.

An OLED is generally made up of a substrate, an anode arranged on the substrate, a hole injection layer arranged on the anode, a hole transport layer arranged on the hole injection layer, an emissive layer arranged on the hole transport layer, an electron transport layer arranged on the emissive layer, an electron injection layer arranged on the electron transport layer, and a cathode arranged on the electron injection layer. The principle of light emission of an OLED display device is that when a semiconductor material and an organic light emission material are driven by an electric field, carrier currents are injected and re-combine to cause emission of light. Specifically, the OLED often uses an indium tin oxide (ITO) pixel electrode and a metal electrode to respectively serve as the anode and cathode of the device and electrons and holes, when driven by a predetermined electrical voltage, are respectively injected into the electron transport layer and the hole transport layer from the cathode and the anode such that the electrons and the holes respectively migrate through the electron transport layer and the hole transport layer to get into the emissive layer and meet in the emissive layer to form excitons that excites light emissive molecules, the later undergoing radiation relaxation to give off visible light.

Based on the way of driving, OLEDs can be classified in two categories, passive matrix OLED (PMOLED) and active matrix OLED (AMOLED), namely one for direct addressing, and the other for TFT array addressing, among which the AMOLED comprises pixels that are arranged in an array and belongs to an active display type, having high light emission performance and being commonly used in high definition large-sized display devices.

In the recent development of the AMOLED display devices, oxide semiconductor TFT are becoming important in the applications of backplane driving TFTs due to high electron mobility, low manufacturing costs, and the potential of making a device size small.

The oxide semiconductor TFTs that are commonly used include etching stopper (ES) oxide semiconductor TFTs and back channel etching (BCE) oxide semiconductor TFTs.

As shown in FIG. 1, an existing etching stopper oxide semiconductor TFT comprises a backing plate 100, a gate electrode 200 disposed on the backing plate 100, a gate insulation layer 300 disposed on the gate electrode 200 and the backing plate 100, an active layer 400 disposed on the gate insulation layer 300 and corresponding to the gate electrode 200, an etching stopper layer 500 disposed on the active layer 400, a source electrode 610 and a drain electrode 620 disposed on the gate insulation layer 300, the active layer 400, and the etching stopper layer 500, a passivation layer 810 disposed on gate insulation layer 300, the source electrode 610, the drain electrode 620, and the etching stopper layer 500, and a planarization layer 820 disposed on the passivation layer 810, wherein the active layer 400 is formed of a material of oxide semiconductor.

An issue of the manufacturing of the above-described etching stopper oxide semiconductor TFT is that a chemical vapor deposition (CVD) must be applied to coat a layer of insulator on the active layer 400 and then, a mask-based operation is conducted to pattern the insulator layer to form the etching stopper layer 500. The etching stopper layer 500 exposes portions of two ends of the active layer 400 to respectively form source contact zone 410 and a drain contact zone 420. An oxide semiconductor TFT made with such a process shows better characteristics and stability. However, an operation of making the etching stopper layer 500 must be additionally included and an additional mask must be involved, the manufacturing process is more complicated and the manufacturing cost is higher.

As shown in FIG. 2, an existing back channel etching oxide semiconductor TFT comprises a backing plate 100', a gate electrode 200' disposed on the backing plate 100', a gate insulation layer 300' disposed on the gate electrode 200' and the backing plate 100', an active layer 400' disposed on the gate insulation layer 300' and corresponding to the gate electrode 200', a source electrode 610' and a drain electrode 620' disposed on the gate insulation layer 300' and the active layer 400', a passivation layer 810' disposed on the gate insulation layer 300', the source electrode 610', and the drain electrode 620', and a planarization layer 820' disposed on the passivation layer 810', wherein the active layer 400' is made of a material of an oxide semiconductor.

The manufacturing method of the above-described back channel etching oxide semiconductor TFT does not need to form an etching stopper layer so that the manufacturing process is simple. However, lacking of protection provided by the etching stopper layer, the active layer 400' will be exposed to acidic etchant solution during an etching operation of the source electrode 610' and the drain electrode 620'. This makes necessary to have the oxide semiconductor material of the active layer 400' showing excellent resistance against acid corrosion and stable molecular structure. This increases the requirements for the manufacturing process of the active layer 400' and also increases the difficulty of manufacturing.

SUMMARY OF THE INVENTION

Objectives of the present invention are to provide a manufacturing method of a thin-film transistor, which has a simple process and a low manufacturing cost and may make a thin-film transistor having excellent properties.

The objectives of the present invention are also to provide a thin-film transistor, which can be manufactured with a simple process with a low manufacturing cost, and has an active layer having a flat and smooth surface, and the thin-film transistors show excellent properties.

To achieve the above objectives, the present invention provides a manufacturing method of a thin-film transistor, which comprises the following steps:

Step 1: providing a backing plate, forming a first metal layer on the backing plate, using a first mask to pattern the first metal layer to form a gate electrode, and forming a gate insulation layer on the gate electrode and the backing plate;

Step 2: forming a semiconductor layer on the gate insulation layer and using a second mask to pattern the semiconductor layer to form an active layer located above and corresponding to the gate electrode;

forming a first photoresist layer on the active layer and the gate insulation layer and using the second mask to subject the first photoresist layer to exposure, wherein during the exposure, a distance between an exposure machine and the first photoresist layer and exposure energy are adjusted such that portions of the first photoresist layer that correspond to two ends of the active layer are subjected to intense exposure; and subjecting the first photoresist layer to development such that a portion of the first photoresist layer that corresponds to an area outside the active layer and the portions that correspond to the two ends of the active layer and are subjected to intense exposure are removed to form a first photoresist pattern;

wherein the first photoresist pattern has a size that is smaller than a size of the active layer and the two ends of the active layer that are not covered by the first photoresist pattern respectively form a source contact zone and a drain contact zone; and Step 3: forming a second metal layer on the first photoresist pattern, the active layer, and the gate insulation layer and forming a second photoresist layer on the second metal layer;

using a third mask to subject the second photoresist layer to exposure and development to form a second photoresist pattern and a third photoresist pattern that are spaced from each other;

using the second photoresist pattern and the third photoresist pattern as masks to carry out an etching operation on the second metal layer so as to form a source electrode and a drain electrode, such that the source electrode and the drain electrode are respectively in contact engagement with the source contact zone and the drain contact zone and cover two end portions of the first photoresist pattern; and removing the second photoresist pattern and the third photoresist pattern and a portion of the first photoresist pattern that corresponds to an area between the source electrode and the drain electrode such that the two end portions of the first photoresist pattern that are respectively covered by the source electrode and the drain electrode are preserved and respectively form a first photoresist segment and a second photoresist segment.

The active layer is formed of a material comprising an oxide semiconductor.

The oxide semiconductor comprises indium gallium zinc oxide.

The method further comprises Step 4: forming a passivation layer on the source electrode, the drain electrode, the active layer, and the gate insulation layer and forming a planarization layer on the passivation layer.

The gate insulation layer and the passivation layer are each formed of a material comprising one or multiple ones of silicon oxide and silicon nitride; and the planarization layer is formed of a material comprising organic photoresist.

The present invention also provides a thin-film transistor, which comprises: a backing plate, a gate electrode arranged on the backing plate, a gate insulation layer arranged on the gate electrode and the backing plate, an active layer arranged on the gate insulation layer and located above and corresponding to the gate electrode, a first photoresist segment and a second photoresist segment arranged on the active layer and respectively corresponding to two side portions of the active layer, a source electrode arranged on the gate insulation layer, the active layer, and the first photoresist segment, and a drain electrode arranged on the gate insulation layer, the active layer, and the second photoresist segment;

wherein the active layer has two ends respectively provided with a source contact zone and a drain contact zone and source electrode and the drain electrode are respectively in contact engagement with the source contact zone and the drain contact zone;

in a horizontal direction, the source electrode is defined as being located at a left side of the drain electrode, the source contact zone located on a left side of the drain contact zone, the first photoresist segment located on a left side of the second photoresist segment;

a right end of the source contact zone is substantially flush with a left end of the first photoresist segment and a right end of the source electrode is substantially flush with a right end of the first photoresist segment; and a left end of the drain contact zone is substantially flush with a right end of the second photoresist segment and a left end of the drain electrode is substantially flush with a left end of the second photoresist segment.

The active layer is formed of a material comprising an oxide semiconductor.

The oxide semiconductor comprises indium gallium zinc oxide.

Also included are a passivation layer arranged on the source electrode, the drain electrode, and the active layer and a planarization layer arranged on the passivation layer.

The gate insulation layer and the passivation layer are each formed of a material comprising one or multiple ones of silicon oxide and silicon nitride; and the planarization layer is formed of a material comprising organic photoresist.

The present invention further provides a thin-film transistor, which comprises: a backing plate, a gate electrode arranged on the backing plate, a gate insulation layer arranged on the gate electrode and the backing plate, an active layer arranged on the gate insulation layer and located above and corresponding to the gate electrode, a first photoresist segment and a second photoresist segment arranged on the active layer and respectively corresponding to two side portions of the active layer, a source electrode arranged on the gate insulation layer, the active layer, and the first photoresist segment, and a drain electrode arranged on the gate insulation layer, the active layer, and the second photoresist segment;

wherein the active layer has two ends respectively provided with a source contact zone and a drain contact zone and source electrode and the drain electrode are respectively in contact engagement with the source contact zone and the drain contact zone;

in a horizontal direction, the source electrode is defined as being located at a left side of the drain electrode, the source contact zone located on a left side of the drain contact zone, the first photoresist segment located on a left side of the second photoresist segment;

a right end of the source contact zone is substantially flush with a left end of the first photoresist segment and a right end of the source electrode is substantially flush with a right end of the first photoresist segment; and a left end of the drain contact zone is substantially flush with a right end of the second photoresist segment and a left end of the drain electrode is substantially flush with a left end of the second photoresist segment;

wherein the active layer is formed of a material comprising an oxide semiconductor;

further comprising: a passivation layer arranged on the source electrode, the drain electrode, and the active layer and a planarization layer arranged on the passivation layer.

The efficacy of the present invention is that the present invention provides a manufacturing method of a thin-film transistor, wherein by forming a first photoresist layer on an active layer and using a mask associated with the active layer to pattern the first photoresist layer so as to form the first photoresist pattern, the first photoresist pattern so formed provides protection of the active layer against corrosion caused by acidic etchant solution in the subsequently conducted etching operation of source and drain electrodes so as to function as an etching stopper layer and further, a major portion of the first photoresist pattern can be removed in a photolithographic process of the source and drain electrodes so that only a minor portion is left in the finally-formed thin-film transistor and does not affect the properties of the thin-film transistor. The present invention provides a thin-film transistor, which has a simple manufacturing process and a low manufacturing cost and the surface of the active layer is flat and smooth. The thin-film transistor shows excellent properties.

For better understanding of the features and technical contents of the present invention, reference will be made to the following detailed description of the present invention and the attached drawings. However, the drawings are provided only for reference and illustration and are not intended to limit the present invention.

BRIEF DESCRIPTION OF THE DRAWINGS

The technical solution, as well as other beneficial advantages, of the present invention will become apparent from the following detailed description of embodiments of the present invention, with reference to the attached drawings.

In the drawings.

DETAILED DESCRIPTION OF THE PREFERRED EMBODIMENTS

To further expound the technical solution adopted in the present invention and the advantages thereof, a detailed description will be given with reference to the preferred embodiments of the present invention and the drawings thereof.

Figure 3:
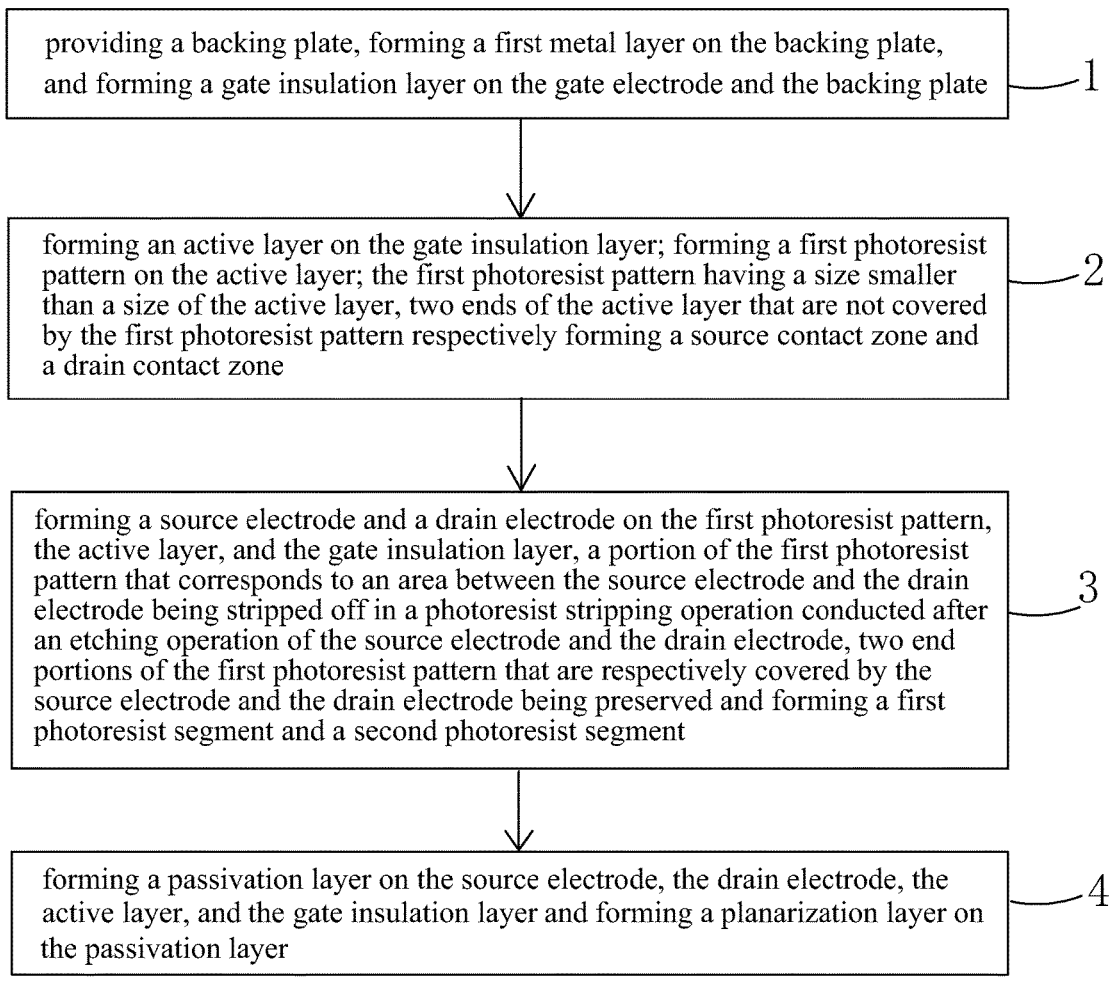
FIG. 3 is a flow chart illustrating a manufacturing method of a thin-film transistor according to the present invention.
Figure 4A:
FIGS. 4A-4C are schematic views illustrating Step 1 of the manufacturing method of the thin-film transistor according to the present invention.
Figure 4B:
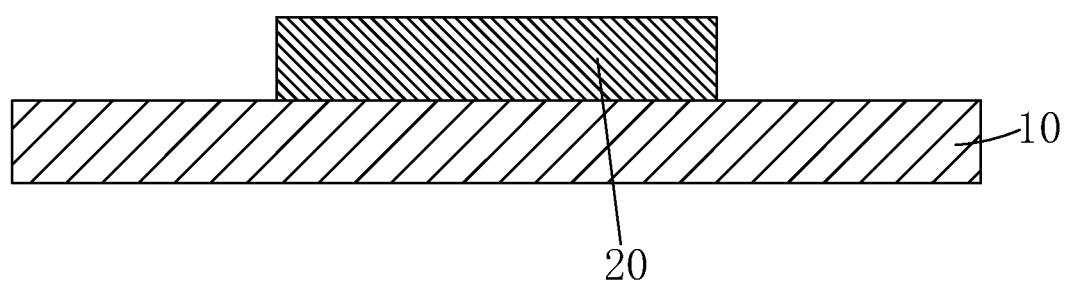
Figure 4C:
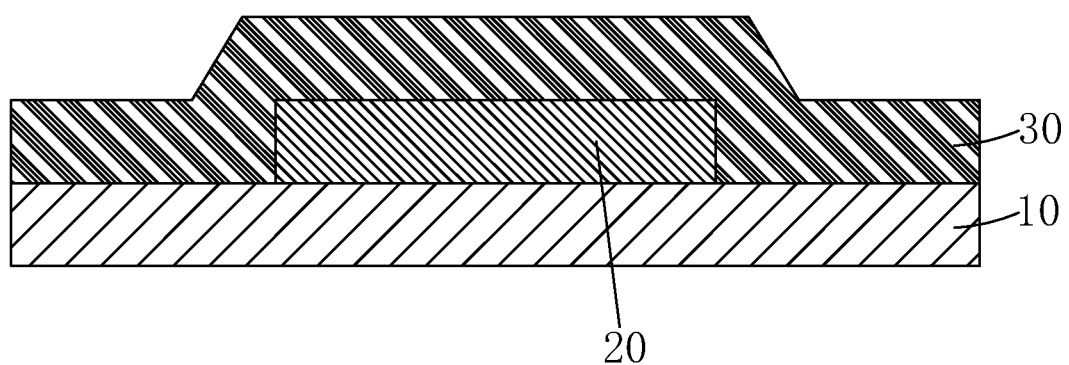

Referring to FIG. 3, firstly, the present invention provides a manufacturing method of a thin-film transistor, which comprises the following steps:

Step 1: as shown in FIGS. 4A-4C, providing a backing plate 10, forming a first metal layer 11 on the backing plate 10, using a first mask 12 to pattern the first metal layer 11 to form a gate electrode 20, and forming a gate insulation layer 30 on the gate electrode 20 and the backing plate 10.

Specifically, the backing plate 10 comprises a glass plate.

Specifically, the gate electrode 20 is formed of a material comprising one or multiple ones of molybdenum (Mo), aluminum (Al), copper (Cu), titanium (Ti), and chromium (Cr).

Specifically, the gate insulation layer 30 is formed of a material comprising one or multiple ones of silicon oxide ($SiO_x$) and silicon nitride ($SiN_x$).

Figure 5A:
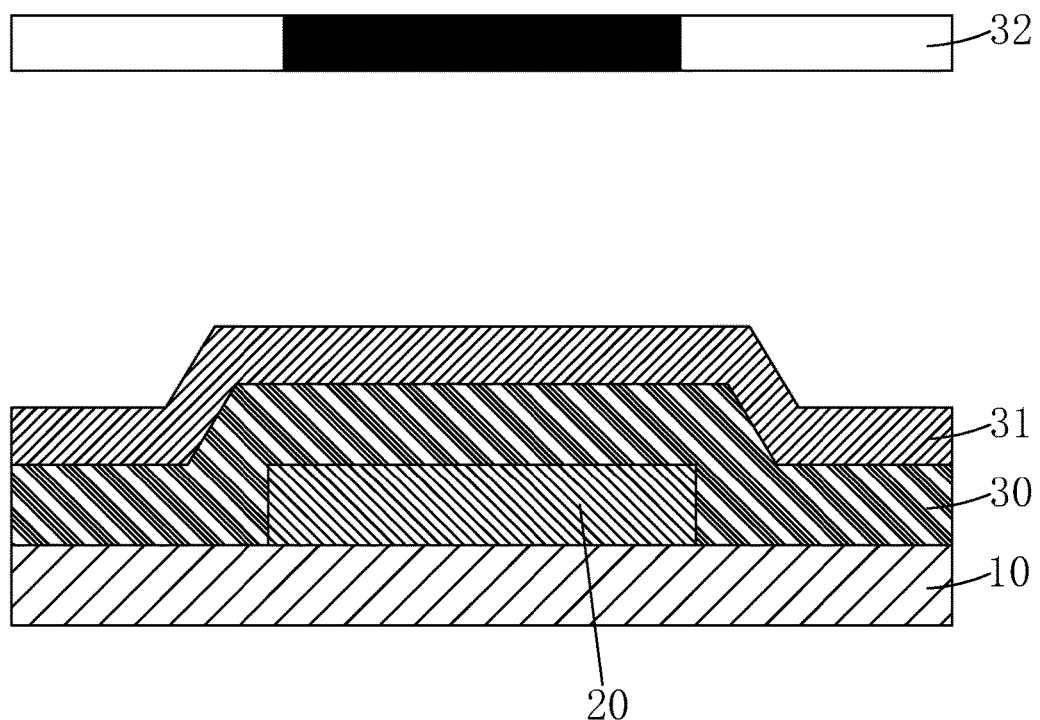
FIGS. 5A-5D are schematic views illustrating Step 2 of the manufacturing method of the thin-film transistor according to the present invention.
Figure 5B:
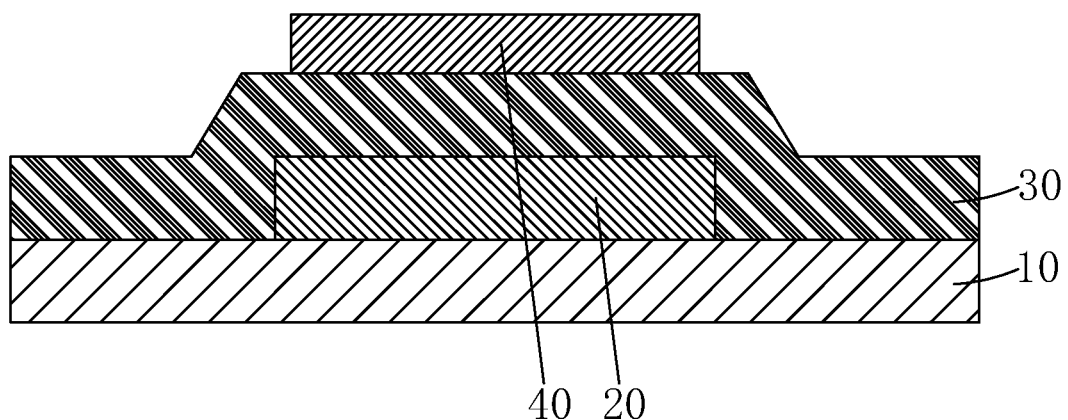
Figure 5C:
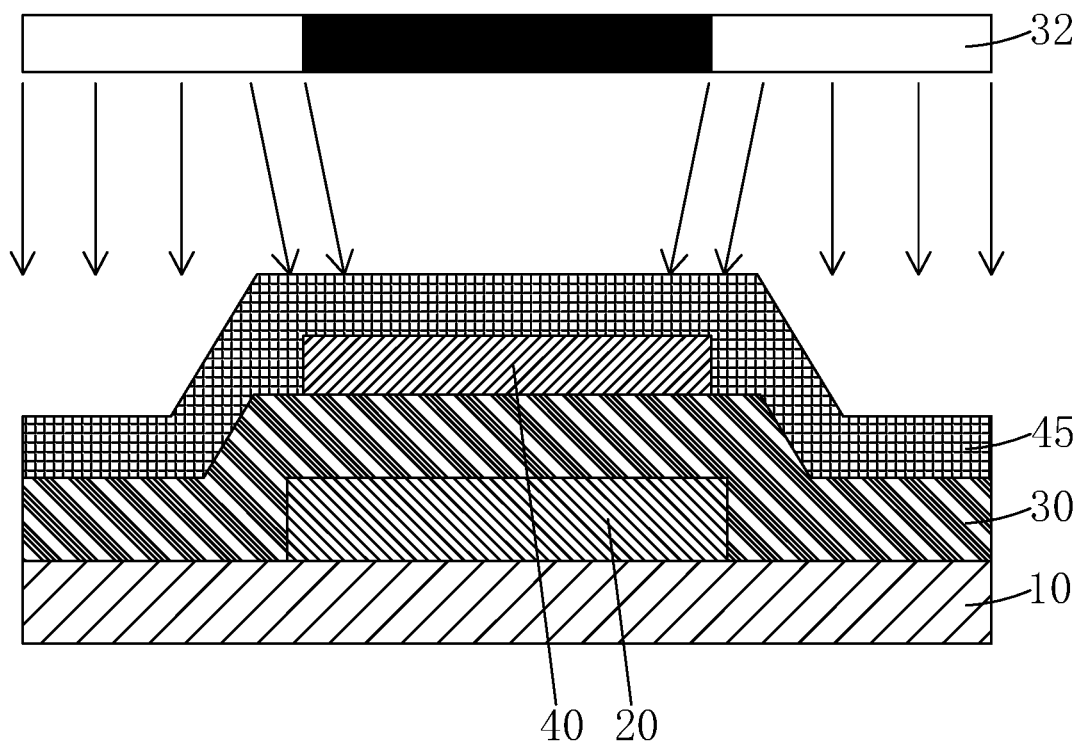
Figure 5D:
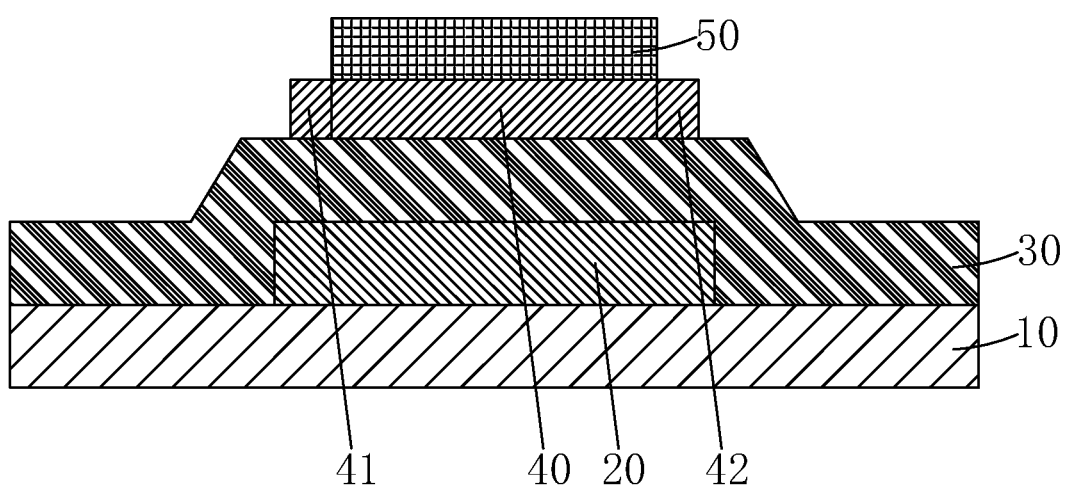

Step 2: as shown in FIGS. 5A-5B, forming a semiconductor layer 31 on the gate insulation layer 30 and using a second mask 32 to pattern the semiconductor layer 31 to form an active layer 40 located above and corresponding to the gate electrode 20;

as shown in FIG. 5C, forming a first photoresist layer 45 on the active layer 40 and the gate insulation layer 30 and using the second mask 32 to subject the first photoresist layer 45 to exposure, wherein during the exposure, a distance between an exposure machine (not shown) and the first photoresist layer 45 and exposure energy are adjusted such that portions of the first photoresist layer 45 that correspond to two ends of the active layer 40 are subjected to intense exposure; and as shown in FIG. 5D, subjecting the first photoresist layer 45 to development such that a portion of the first photoresist layer 45 that corresponds to an area outside the active layer 40 and the portions that correspond to the two ends of the active layer 40 and are subjected to intense exposure are removed to form a first photoresist pattern 50;

wherein the first photoresist pattern 50 has a size that is smaller than a size of the active layer 40 and the two ends of the active layer 40 that are not covered by the first photoresist pattern 50 respectively form a source contact zone 41 and a drain contact zone 42.

Specifically, the active layer 40 is formed of a material comprising an oxide semiconductor, and preferably, the oxide semiconductor is indium gallium zinc oxide (IGZO).

Figure 6A:
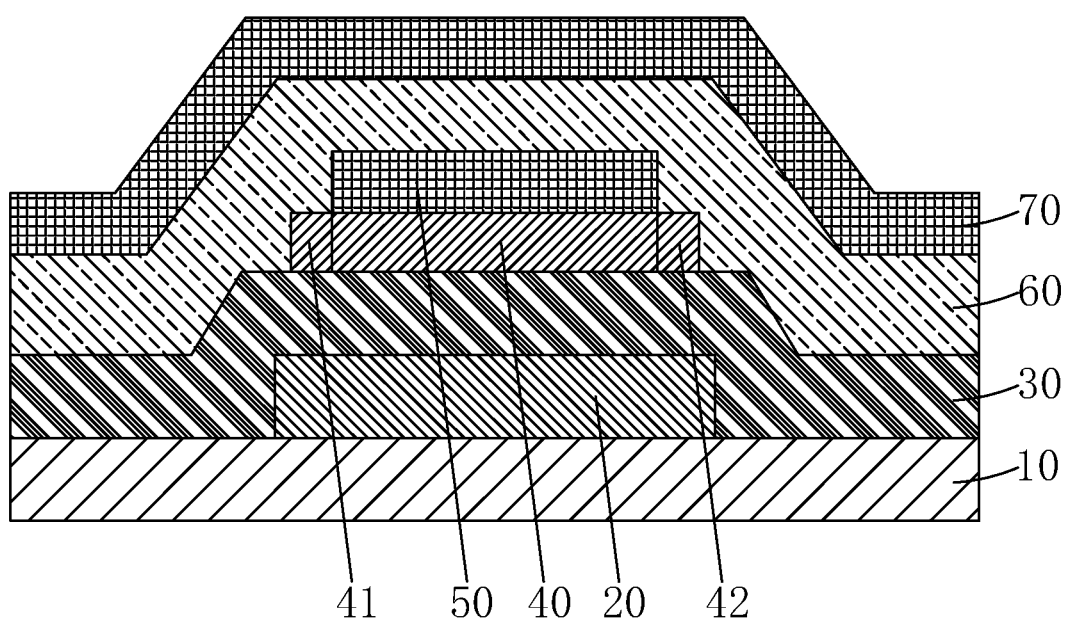
FIGS. 6A-6D are schematic views illustrating Step 3 of the manufacturing method of the thin-film transistor according to the present invention.
Figure 6B:
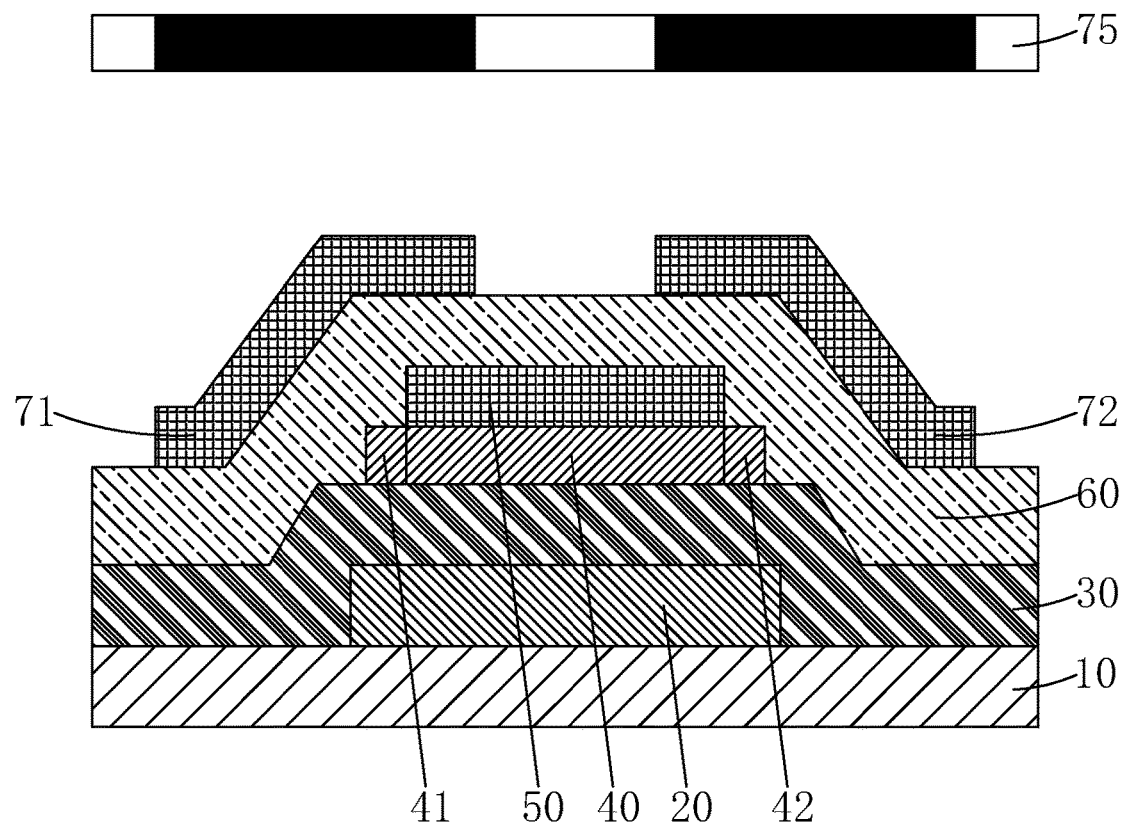
Figure 6C:
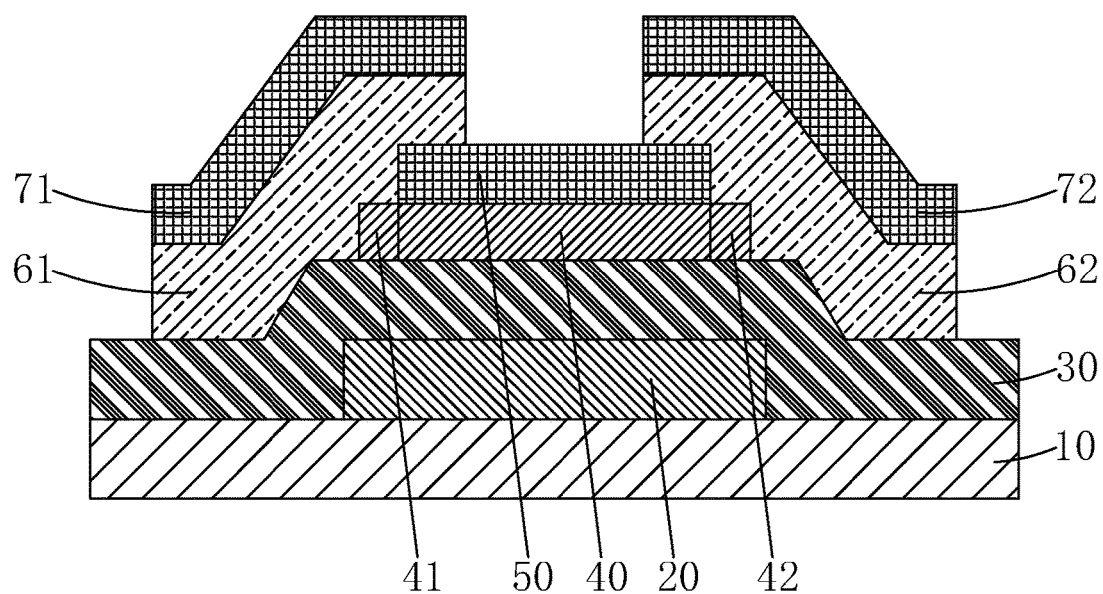
Figure 6D:
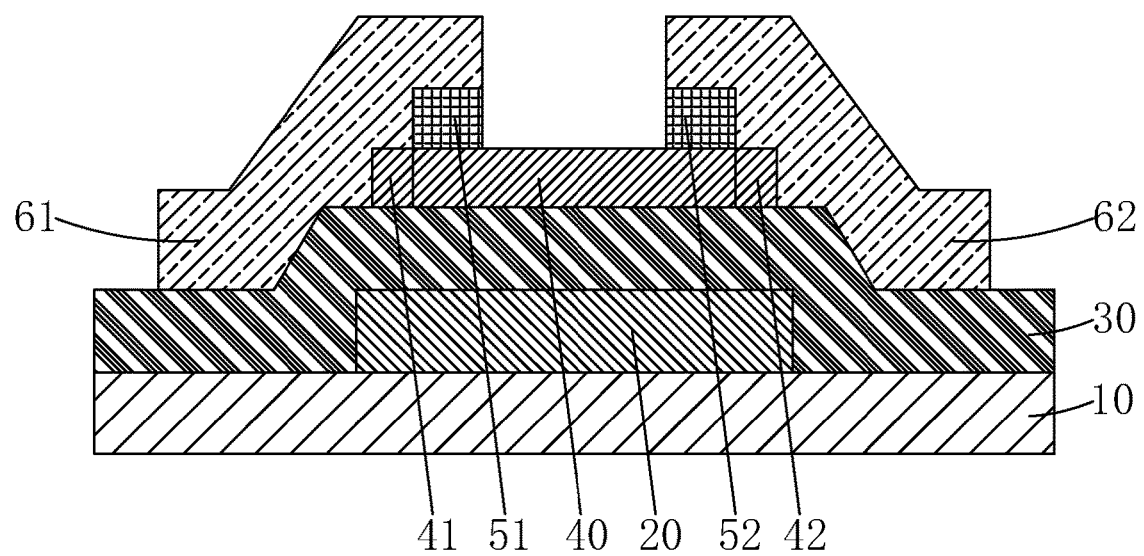

Step 3: as shown in FIG. 6A, forming a second metal layer 60 on the first photoresist pattern 50, the active layer 40, and the gate insulation layer 30 and forming a second photoresist layer 70 on the second metal layer 60;

as shown in FIG. 6B, using a third mask 75 to subject the second photoresist layer 70 to exposure and development to form a second photoresist pattern 71 and a third photoresist pattern 72 that are spaced from each other;

as shown in FIG. 6C, using the second photoresist pattern 71 and the third photoresist pattern 72 as masks to carry out an etching operation on the second metal layer 60 so as to form a source electrode 61 and a drain electrode 62, such that the source electrode 61 and the drain electrode 62 are respectively in contact engagement with the source contact zone 41 and the drain contact zone 42 and cover two end portions of the first photoresist pattern 50; and as shown in FIG. 6D, removing the second photoresist pattern 71 and the third photoresist pattern 72 and a portion of the first photoresist pattern 50 that corresponds to an area between the source electrode 61 and the drain electrode 62 such that the two end portions of the first photoresist pattern 50 that are respectively covered by the source electrode 61 and the drain electrode 62 are preserved and respectively form a first photoresist segment 51 and a second photoresist segment 52.

Specifically, the source electrode 61 and the drain electrode 62 are formed of a material comprising one or multiple ones of molybdenum (Mo), aluminum (Al), copper (Cu), titanium (Ti), and chromium (Cr).

Specifically, in Step 3, the etching operation carried out on the second metal layer 60 is wet etching.

Specifically, in Step 3, by using the first photoresist pattern 50 as an etching stopper layer, the active layer 40 is effectively protected against corrosion caused by acidic etchant solution during the etching operation of the source electrode 61 and the drain electrode 62 so as to ensure integrity of a surface of the active layer 40, making properties of the thin-film transistor stable and reliable. Further, a major portion of the first photoresist pattern 50 is removed simultaneously with the second photoresist pattern 71 and the third photoresist pattern 72 in the same photoresist stripping process so that only a minor portion is left in a completed thin-film transistor, making it not affecting the properties of the thin-film transistor.

Figure 7:
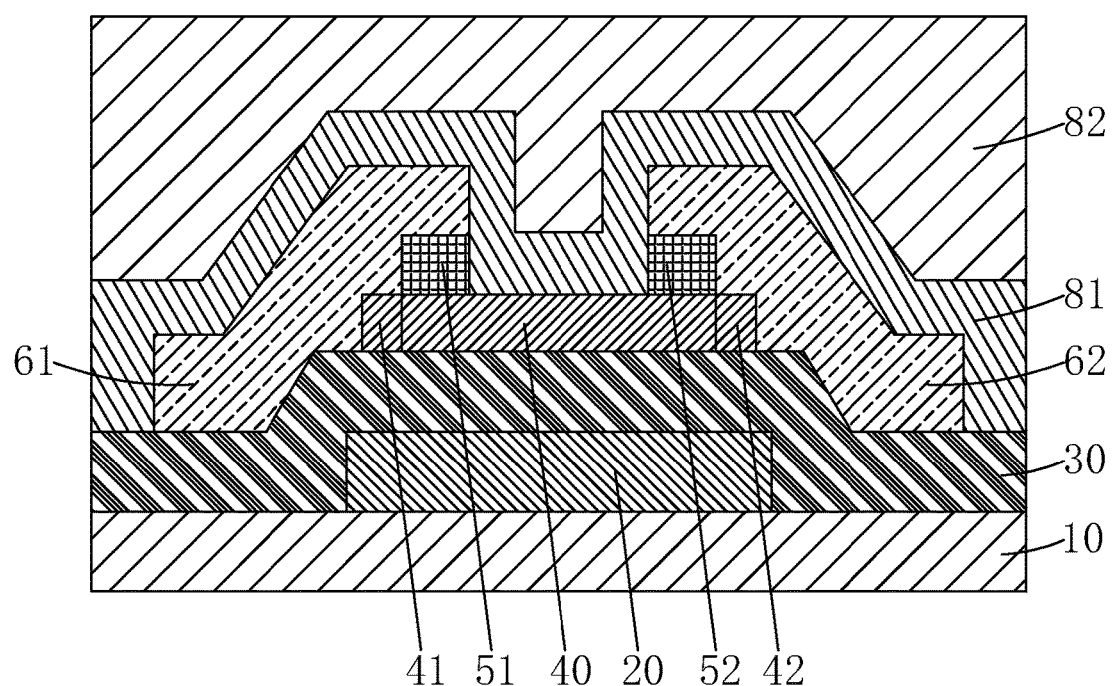
FIG. 7 is a schematic view illustrating Step 4 of the manufacturing method of the thin-film transistor according to the present invention and is also a schematic view illustrating the structure of a thin-film transistor according to the present invention.

Step 4: as shown in FIG. 7, forming a passivation layer 81 on the source electrode 61, the drain electrode 62, the active layer 40, and the gate insulation layer 30 and forming a planarization layer 82 on the passivation layer 81.

Specifically, the passivation layer 81 is formed of a material comprising one or multiple ones of silicon oxide ($SiO_x$) and silicon nitride ($SiN_x$).

Specifically, the planarization layer 82 is formed of a material comprising organic photoresist.

In the above-described manufacturing method of a thin-film transistor, by forming the first photoresist layer 45 on the active layer 40 and using the mask (the second mask 32) of the active layer 40 to pattern the first photoresist layer 45 so as to form the first photoresist pattern 50, the first photoresist pattern 50 so formed provides protection of the active layer 40 against corrosion caused by acidic etchant solution in the subsequently conducted etching operation of the source and drain electrodes 61, 62 so as to function as an etching stopper layer and further, a major portion of the first photoresist pattern 50 can be removed in a photolithographic process of the source and drain electrodes 61, 62 so that only a minor portion is left in the finally-formed thin-film transistor and does not affect the properties of the thin-film transistor.

Figure 1:
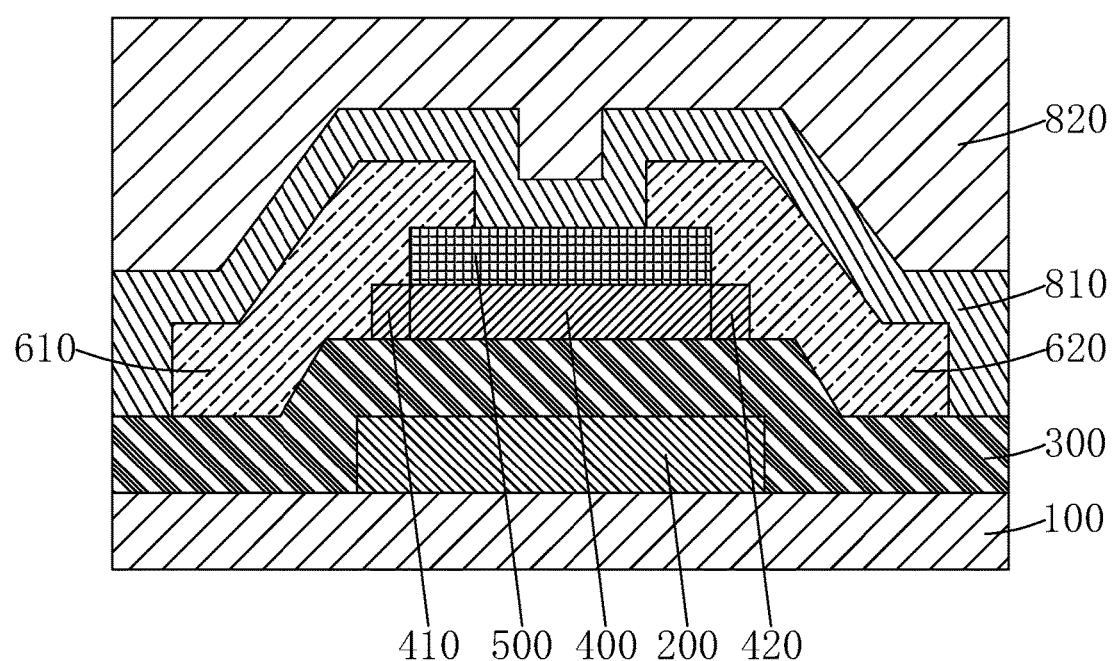
FIG. 1 is a schematic view illustrating the structure of a conventional etching stopper oxide semiconductor thin-film transistor (TFT)
Figure 2:
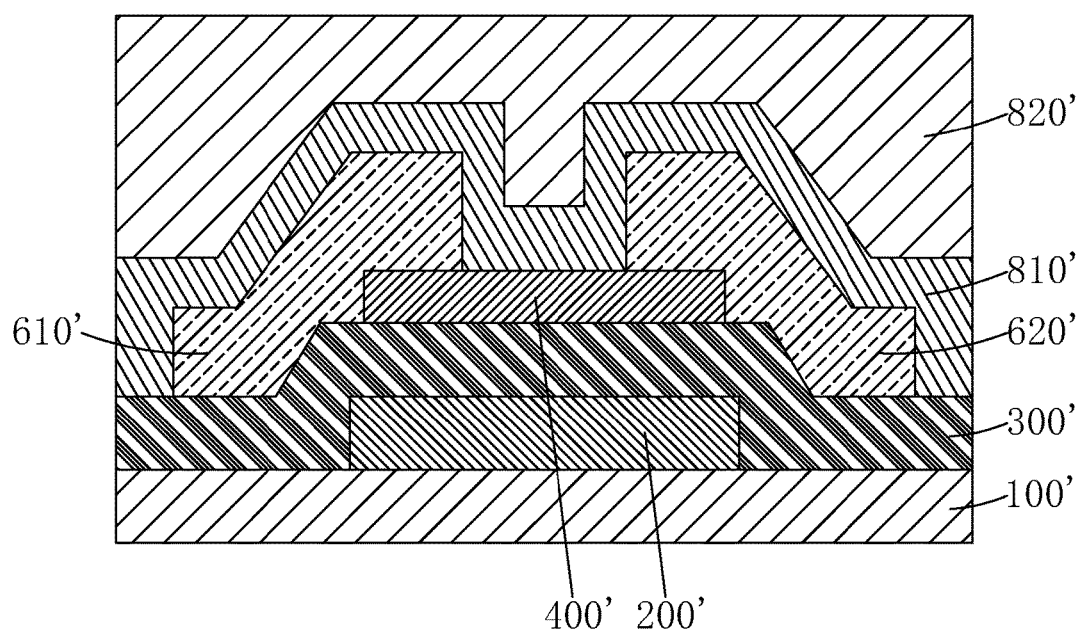
FIG. 2 is a schematic view illustrating the structure of a conventional back channel etching oxide semiconductor TFT.

Comparing with the manufacturing process of an etching stopper oxide semiconductor TFT illustrated in FIG. 1, the present invention saves one mask and also saves the chemical vapor deposition and dry etching operations necessary for forming an etching stopper layer 500, reducing the costs of fixtures and operations. Compared to the manufacturing process of a back channel etching oxide semiconductor TFT illustrated in FIG. 2, the present invention does not need to take the potential risk of damaging the surface of the active layer 40 by the acidic etchant solution applied in the etching operation of the source and drain electrodes 61, 62 so as to ensure integrity of the surface of the active layer 40 and thus ensuring the properties of the TFT channel more stable and more reliable. The manufacturing method of a thin-film transistor according to the present invention is generally between the conventional etching stopper oxide semiconductor TFT manufacturing method and the conventional back channel etching oxide semiconductor TFT manufacturing method and provides prominent advantages of ensuring protection of the active layer 40 during the etching operation of the source and drain electrodes 61, 62 by the first photoresist pattern 50 and also allowing a major portion of the first photoresist pattern 50 to be removed by a subsequent photoresist stripping operation conducted after the completion of the etching operation to eventually provide a novel oxide semiconductor TFT structure. Such a manufacturing method is of excellent potential application in existing TFT manufacturing processes without the necessity of modifying existing machine arrangements.

Referring to FIG. 7, based on the above-described manufacturing method of a thin-film transistor, the present invention also provides a thin-film transistor, which comprises: a backing plate 10; a gate electrode 20 arranged on the backing plate 10; a gate insulation layer 30 arranged on the gate electrode 20 and the backing plate 10; an active layer 40 arranged on the gate insulation layer 30 and located above and corresponding to the gate electrode 20; a first photoresist segment 51 and a second photoresist segment 52 arranged on the active layer 40 and respectively corresponding to two sides of the active layer 40; a source electrode 61 arranged on the gate insulation layer 30, the active layer 40, and the first photoresist segment 51; a drain electrode 62 arranged on the gate insulation layer 30, the active layer 40, and the second photoresist segment 52; a passivation layer 81 arranged on the source electrode 61, the drain electrode 62, and the active layer 40; and a planarization layer 82 arranged on the passivation layer 81.

The active layer 40 has two ends respectively provided with a source contact zone 41 and a drain contact zone 42. The source electrode 61 and the drain electrode 62 are respectively in contact engagement with the source contact zone 41 and the drain contact zone 42.

In a horizontal direction, the source electrode 61 is defined as being located on a left side of the drain electrode 62; the source contact zone 41 is located on a left side of the drain contact zone 42; and the first photoresist segment 51 is located on a left side of the second photoresist segment 52.

A right end of the source contact zone 41 is substantially flush with a left end of the first photoresist segment 51 and a right end of the source electrode 61 is substantially flush with a right end of the first photoresist segment 51.

A left end of the drain contact zone 42 is substantially flush with a right end of the second photoresist segment 52 and a left end of the drain electrode 62 is substantially flush with a left end of the second photoresist segment 52.

Specifically, the backing plate 10 comprises a glass plate.

Specifically, the gate electrode 20, the source electrode 61 and the drain electrode 62 is formed of a material comprising one or multiple ones of molybdenum (Mo), aluminum (Al), copper (Cu), titanium (Ti), and chromium (Cr).

Specifically, the gate insulation layer 30 is formed of a material comprising one or multiple ones of silicon oxide ($SiO_x$) and silicon nitride ($SiN_x$).

Specifically, the active layer 40 is formed of a material comprising an oxide semiconductor, and preferably, the oxide semiconductor is indium gallium zinc oxide (IGZO).

Specifically, the passivation layer 81 is formed of a material comprising one or multiple ones of silicon oxide ($SiO_x$) and silicon nitride ($SiN_x$).

Specifically, the planarization layer 82 is formed of a material comprising organic photoresist.

The above-described thin-film transistor has a simple manufacturing process and a low manufacturing cost and the surface of the active layer 40 is flat and smooth. The thin-film transistor shows excellent properties.

In summary, the present invention provides a thin-film transistor and a manufacturing method thereof. The manufacturing method of the thin-film transistor according to the present invention is such that by forming a first photoresist layer on an active layer and using a mask associated with the active layer to pattern the first photoresist layer so as to form the first photoresist pattern, the first photoresist pattern so formed provides protection of the active layer against corrosion caused by acidic etchant solution in the subsequently conducted etching operation of source and drain electrodes so as to function as an etching stopper layer and further, a major portion of the first photoresist pattern can be removed in a photolithographic process of the source and drain electrodes so that only a minor portion is left in the finally-formed thin-film transistor and does not affect the properties of the thin-film transistor. The thin-film transistor according to the present invention has a simple manufacturing process and a low manufacturing cost and the surface of the active layer is flat and smooth. The thin-film transistor shows excellent properties.

Based on the description given above, those having ordinary skills in the art may easily contemplate various changes and modifications of he technical solution and the technical ideas of the present invention. All these changes and modifications are considered belonging to the protection scope of the present invention as defined in the appended claims.

What is claimed is:

1. A manufacturing method of a thin-film transistor, comprising the following steps:
   Step 1: providing a backing plate, forming a first metal layer on the backing plate, using a first mask to pattern the first metal layer to form a gate electrode, and forming a gate insulation layer on the gate electrode and the backing plate;
   Step 2: forming a semiconductor layer on the gate insulation layer and using a second mask to pattern the semiconductor layer to form an active layer located above and corresponding to the gate electrode;
   forming a first photoresist layer on the active layer and the gate insulation layer and using the second mask to subject the first photoresist layer to exposure, wherein during the exposure, a distance between an exposure machine and the first photoresist layer and exposure energy are adjusted such that portions of the first photoresist layer that correspond to two ends of the active layer are subjected to intense exposure; and
   subjecting the first photoresist layer to development such that a portion of the first photoresist layer that corresponds to an area outside the active layer and the portions that correspond to the two ends of the active layer and are subjected to intense exposure are removed to form a first photoresist pattern;
   wherein the first photoresist pattern has a size that is smaller than a size of the active layer and the two ends of the active layer that are not covered by the first photoresist pattern respectively form a source contact zone and a drain contact zone; and
   Step 3: forming a second metal layer on the first photoresist pattern, the active layer, and the gate insulation layer and forming a second photoresist layer on the second metal layer;
   using a third mask to subject the second photoresist layer to exposure and development to form a second photoresist pattern and a third photoresist pattern that are spaced from each other;
   using the second photoresist pattern and the third photoresist pattern as masks to carry out an etching operation on the second metal layer so as to form a source electrode and a drain electrode, such that the source electrode and the drain electrode are respectively in contact engagement with the source contact zone and the drain contact zone and cover two end portions of the first photoresist pattern; and
   removing the second photoresist pattern and the third photoresist pattern and a portion of the first photoresist pattern that corresponds to an area between the source electrode and the drain electrode such that the two end portions of the first photoresist pattern that are respectively covered by the source electrode and the drain electrode are preserved and respectively form a first photoresist segment and a second photoresist segment.

2. The manufacturing method of the thin-film transistor as claimed in claim 1, wherein the active layer is formed of a material comprising an oxide semiconductor.

3. The manufacturing method of the thin-film transistor as claimed in claim 2, wherein the oxide semiconductor comprises indium gallium zinc oxide.

4. The manufacturing method of the thin-film transistor as claimed in claim 1 further comprising Step 4: forming a passivation layer on the source electrode, the drain electrode, the active layer, and the gate insulation layer and forming a planarization layer on the passivation layer.

5. The manufacturing method of the thin-film transistor as claimed in claim 4, wherein the gate insulation layer and the passivation layer are each formed of a material comprising one or multiple ones of silicon oxide and silicon nitride; and the planarization layer is formed of a material comprising organic photoresist.

6. A thin-film transistor, comprising: a backing plate, a gate electrode arranged on the backing plate, a gate insulation layer arranged on the gate electrode and the backing plate, an active layer arranged on the gate insulation layer and located above and corresponding to the gate electrode, a first photoresist segment and a second photoresist segment arranged on the active layer and respectively corresponding to two side portions of the active layer, a source electrode arranged on the gate insulation layer, the active layer, and the first photoresist segment, and a drain electrode arranged on the gate insulation layer, the active layer, and the second photoresist segment;
   wherein the active layer has two ends respectively provided with a source contact zone and a drain contact zone and source electrode and the drain electrode are respectively in contact engagement with the source contact zone and the drain contact zone;
   in a horizontal direction, the source electrode is defined as being located at a left side of the drain electrode, the source contact zone located on a left side of the drain contact zone, the first photoresist segment located on a left side of the second photoresist segment;
   a right end of the source contact zone is substantially flush with a left end of the first photoresist segment and a right end of the source electrode is substantially flush with a right end of the first photoresist segment; and
   a left end of the drain contact zone is substantially flush with a right end of the second photoresist segment and a left end of the drain electrode is substantially flush with a left end of the second photoresist segment.

7. The thin-film transistor as claimed in claim 6, wherein the active layer is formed of a material comprising an oxide semiconductor.

8. The thin-film transistor as claimed in claim 7, wherein the oxide semiconductor comprises indium gallium zinc oxide.

9. The thin-film transistor as claimed in claim 6 further comprising: a passivation layer arranged on the source electrode, the drain electrode, and the active layer and a planarization layer arranged on the passivation layer.

10. The thin-film transistor as claimed in claim 9, wherein the gate insulation layer and the passivation layer are each formed of a material comprising one or multiple ones of silicon oxide and silicon nitride; and the planarization layer is formed of a material comprising organic photoresist.

11. A thin-film transistor, comprising: a backing plate, a gate electrode arranged on the backing plate, a gate insulation layer arranged on the gate electrode and the backing plate, an active layer arranged on the gate insulation layer and located above and corresponding to the gate electrode, a first photoresist segment and a second photoresist segment arranged on the active layer and respectively corresponding to two side portions of the active layer, a source electrode arranged on the gate insulation layer, the active layer, and the first photoresist segment, and a drain electrode arranged on the gate insulation layer, the active layer, and the second photoresist segment;
wherein the active layer has two ends respectively provided with a source contact zone and a drain contact zone and source electrode and the drain electrode are respectively in contact engagement with the source contact zone and the drain contact zone;
in a horizontal direction, the source electrode is defined as being located at a left side of the drain electrode, the source contact zone located on a left side of the drain contact zone, the first photoresist segment located on a left side of the second photoresist segment;
a right end of the source contact zone is substantially flush with a left end of the first photoresist segment and a right end of the source electrode is substantially flush with a right end of the first photoresist segment; and
a left end of the drain contact zone is substantially flush with a right end of the second photoresist segment and a left end of the drain electrode is substantially flush with a left end of the second photoresist segment;
wherein the active layer is formed of a material comprising an oxide semiconductor;
further comprising: a passivation layer arranged on the source electrode, the drain electrode, and the active layer and a planarization layer arranged on the passivation layer.

12. The thin-film transistor as claimed in claim 11, wherein the oxide semiconductor comprises indium gallium zinc oxide.

13. The thin-film transistor as claimed in claim 11, wherein the gate insulation layer and the passivation layer are each formed of a material comprising one or multiple ones of silicon oxide and silicon nitride; and the planarization layer is formed of a material comprising organic photoresista.

* * * * *